United States Patent [19]

Moughanni et al.

[11] Patent Number: 5,636,228
[45] Date of Patent: Jun. 3, 1997

[54] SCAN REGISTER WITH DECOUPLED SCAN ROUTING

[75] Inventors: Claude Moughanni, Austin, Tex.; Jeff Maguire, Munich, Germany

[73] Assignee: Motorola, Inc., Schaumburg, Ill.

[21] Appl. No.: 586,356

[22] Filed: Jan. 16, 1996

[51] Int. Cl.$^6$ .................................................. G01R 31/28
[52] U.S. Cl. ................................. 371/22.3; 295/183.06
[58] Field of Search ............................. 371/22.3, 22.1, 371/22.2, 22.5, 22.6, 25.1; 395/183.06

[56] References Cited

U.S. PATENT DOCUMENTS 5,513,186  4/1996  Levitt ................................ 371/22.3
5,596,584  1/1997  Warren ............................... 371/22.3

*Primary Examiner*—Vincent P. Canney

[57] ABSTRACT

A scan register (80) provides for the decoupling of the scan data output signal (117) from the data output signal (116). This is provided through a tri-statable device (88), which is controlled by a scan enable signal or by the scan clock signal.

14 Claims, 4 Drawing Sheets

SCAN REGISTER WITH DECOUPLED SCAN ROUTING

FIELD OF THE INVENTION

The present disclosure relates in general to data processing systems, and in particular, to scan registers within logic circuitry.

BACKGROUND OF THE INVENTION

Logic circuitry, such as that found within various portions (e.g., a processor) of a data processing system, typically incorporates circuitry for enabling the designer and manufacturer of the logic circuitry to test the accuracy of the logic circuitry. Logic circuitry typically comprises various stages of combinatorial logic circuits, where each stage outputs data to a register for temporary storage before passage to a next stage of combinatorial logic circuits. One way of testing these various stages of combinatorial logic is to scan values into the registers, allow these values to propagate through the combinatorial logic into a register at the output, and to scan out the results from the output register to verify that the combinatorial logic circuits perform their specified logic operations on the inputted data.

A common technique for scanning values into and out of registers is to utilize a scan register, which during normal operation, operates as a normal register to pass data from one stage of combinatorial logic circuits to another. These scan registers, during a testing mode, allow for the input and output of data values while disabling the normal operational mode of these registers.

Typical scan register 60 is shown in FIG. 6. The master portion of register 60 includes devices 61–64, while a slave portion of register 60 includes devices 65–67. Devices 61–67 each include an inverter circuit with devices 61, 62, 64, 65 and 67 being tri-statable devices. Device 61 passes data on the high (logical "1" or asserted) portion of a clock (CLK) signal while device 64 passes data on the low (logical "0" or negated) portion of the CLK signal. Device 62 passes data on the high portion of a scan clock (SCLK) signal, while device 64 may also pass data on the low portion of the SCLK signal. Device 65 passes data on the high portion of signal CLK_SCLK_B signal, which means that either the CLK or the SCLK clock signals will activate device 65. Device 67 passes data during the low portion of the CLK_SCLK_B signal. In one embodiment of the present invention, the CLK_SCLK_B signal is formed as the Boolean NOR function of the CLK signal and the SCLK signal (i.e. the CLK_SCLK_B signal is active only when both the CLK signal and the SCLK signal are inactive). Device 61 receives data (Din), which may originate within some stage of combinatorial logic. Device 62 receives scan data (Sin), which may be received from scan control logic (discussed further below) or from a previous scan register. Device 66 outputs either regular data (Dout), or scan data (Sout).

The master portion of register 60 latches either the Din signal or the Sin signal, during the active high portion of the corresponding clock signal. This data is then transferred to the slave portion of scan register 60 during the low phase of the corresponding clock signal. The master operation is controlled by either the CLK signal (for Din) or the SCLK signal (for Sin). The slave portion is controlled by the CLK_SCLK_B signal, which latches the master data, transferring it to the Dout/Sout signal.

A scan chain is formed by connecting the Sout signal of one scan register to the Sin signal of a next scan register in the scan chain. Once all registers are tied together, the Sin signal of the first register in the scan chain is the input from scan control logic, and the Sout signal of the last register becomes the output of the scan chain. Serial data is fed into and taken out of the scan chain to read and write the parallel Din and Dout signals, respectively.

During scan mode, which is used to set up data into registers and read out the previously captured data, the scan clocks are used. When the SCLK signal becomes active, Sin data is loaded into the master portion of a scan register. The CLK_SCLK_B signal acts as an active low signal of SCLK, loading the data from the master to the slave, and placing the scan data at the output when the CLK_SCLK_B signal goes low. In this mode, the CLK signal is held inactive, so that the Din signal does not collide with the Sin signal. One can consider the master portion of scan register 60 as performing a clocked multiplexor latch operation. Note that the SCLK and CLK signals do not need to be generated from the same clock signal. For example, scan registers may use opposite phases of a clock to drive the CLK and SCLK signals if cycle isolation between normal mode and scan mode is used. In addition, the CLK and SCLK signals may be driven by clocks of different frequencies.

During normal operation of register 60, the SCLK signal is held inactive and the CLK signal toggles and functions as the clock for the master portion of scan register 60. The CLK_SCLK_B signal toggles and functions as the clock for the slave portion of scan register 60, advancing the latched Din signal to the slave portion of register 60. The CLK_SCLK_B signal is active in both modes because the data from the master is the same for both cases.

Since the data output (Dout) and the scan output (Sout) of scan register 60 are a shared signal, the scan routing loads the output of register 60. This creates an excess load, impacting both the speed and energy consumption of register 60. Since the scan chain loading depends on the placement of the registers within an integrated circuit, and the order in which the registers are connected, the loading can be much higher than the loading for the Dout signal. For example, the Sout signal from one scan register may be routed to the Sin signal of another scan register a considerable distance apart, requiring that larger devices be implemented within the scan registers in order to drive the signal through the long scan route. Larger devices also result in an impact on the required area within an integrated circuit.

As a result of the foregoing, there is a need in the art for an improved scan register that lessens the impact on the speed and energy consumption of the register and the semiconductor area needed to implement such a scan register.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 1:
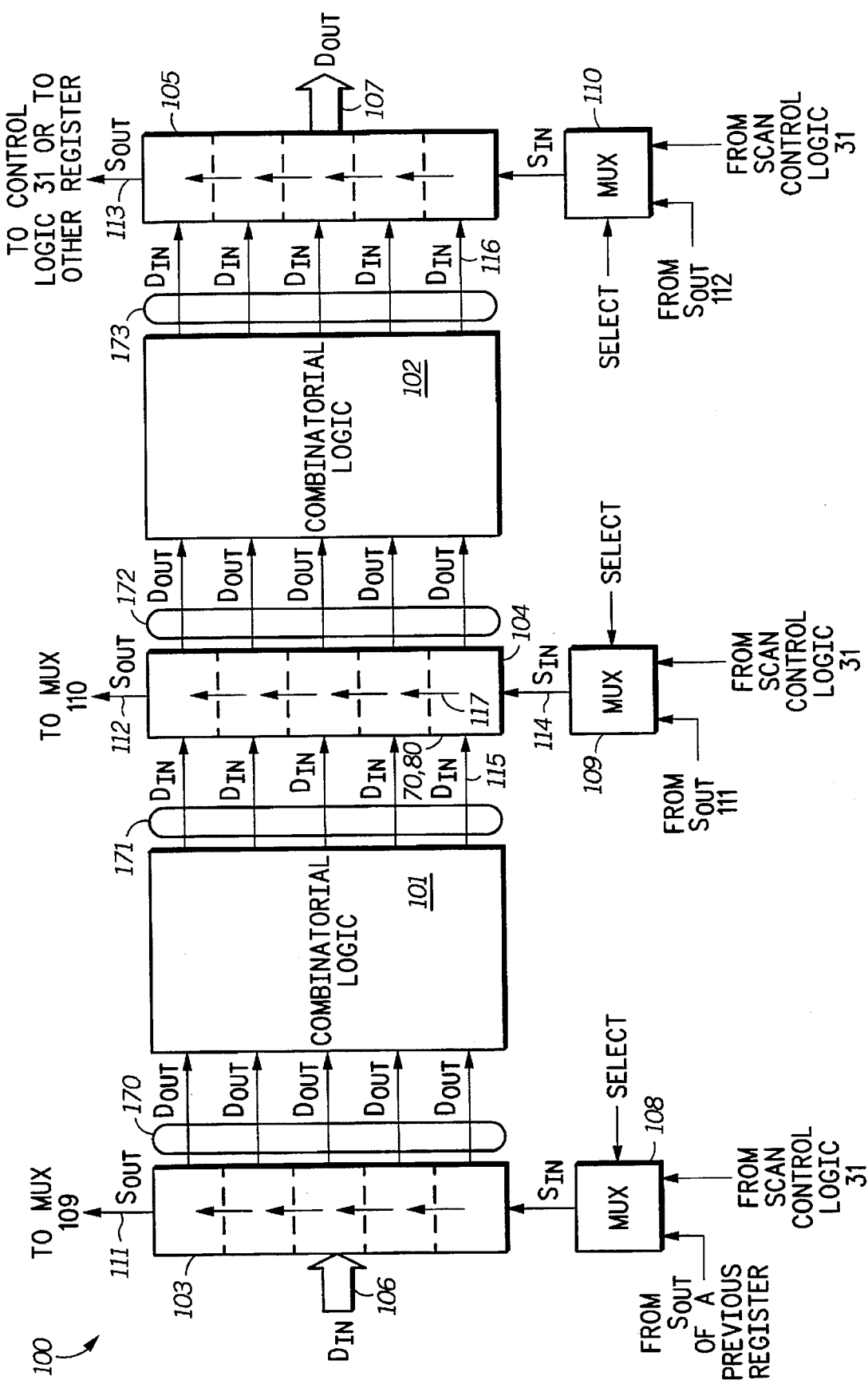
FIG. 1 illustrates logic circuitry configured in accordance with the present invention.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 4:
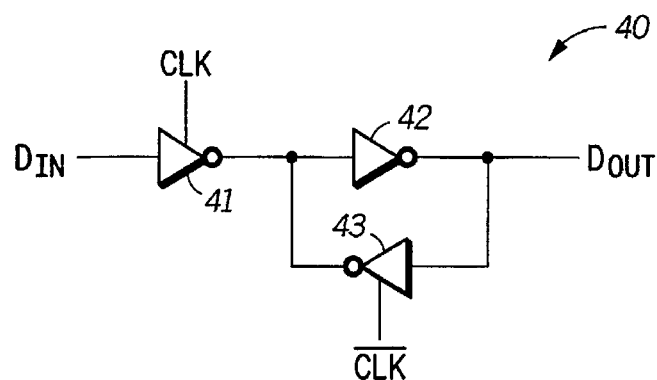
FIG. 4 illustrates a configuration of a typical prior art latch circuit.
Figure 5:
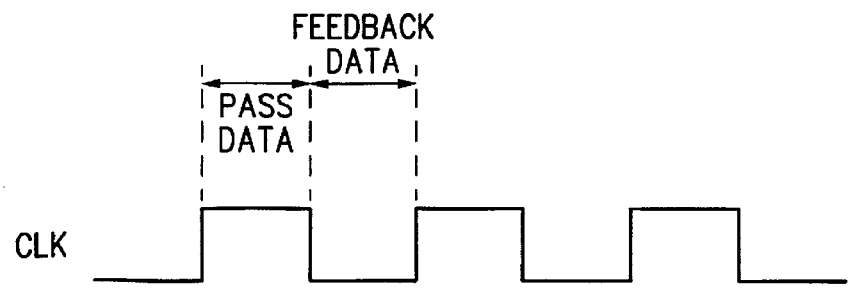
FIG. 5 illustrates the clocking of the latch circuit illustrated in FIG. 4.
Figure 6:
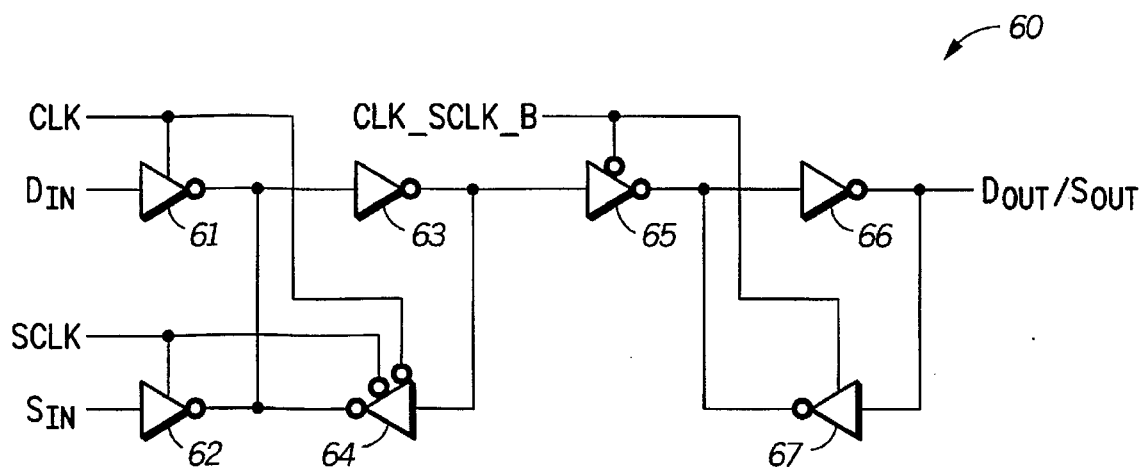
FIG. 6 illustrates a prior art scan register.

Referring to FIG. 4, there is illustrated typical latch 40, which shows the basic structure of latched circuitry used within scan registers. Inputted data (Din) is received by inverter circuit 41, which passes an inverted version of Din on the high portion of the received CLK clock signal. FIG. 5 illustrates the CLK signal. Device 42 inverts this inverted Din signal for passage as outputted data (Dout). This outputted Dout signal is latched by inverter circuit 43, which receives the Dout signal and passes it to the input of device 42 on the low portion of the CLK signal. Thus, during one clock cycle, received data is passed by latch 40.

Figure 3:
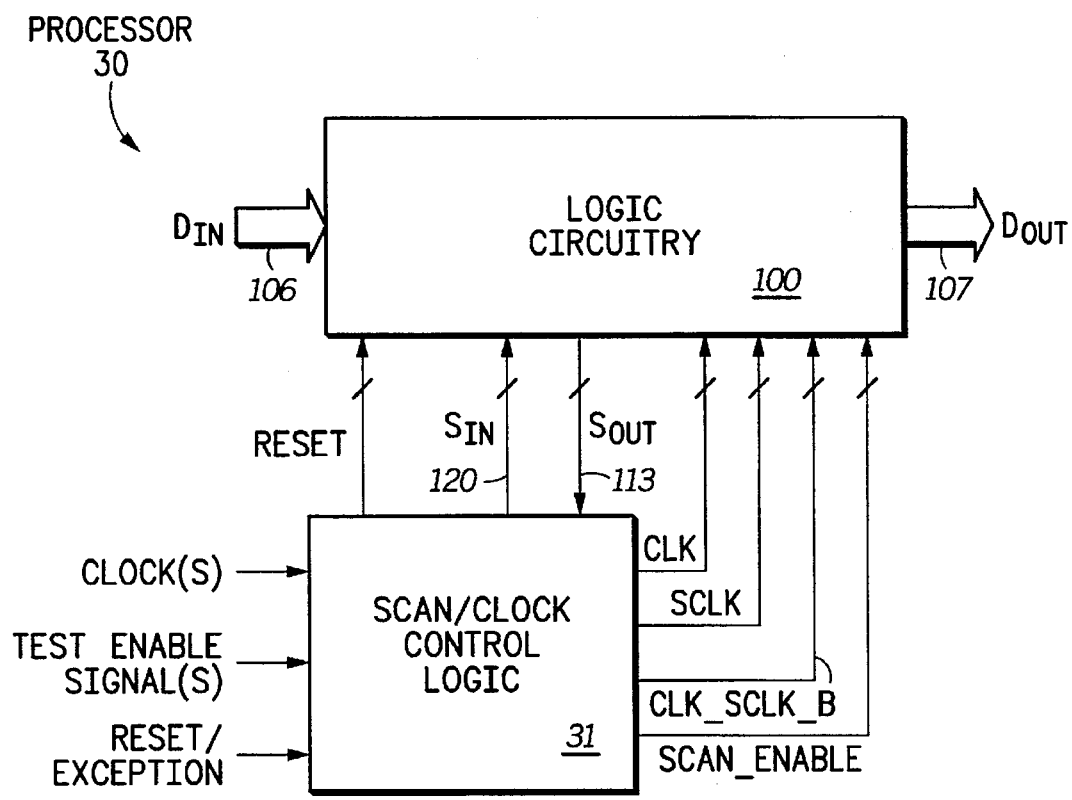
FIG. 3 illustrates a processor configured in accordance with the present invention.

Referring next to FIG. 1, there is illustrated logic circuitry portion 100, which may be implemented within any portion of a data processing system, such as logic circuitry within a processor 30 (see FIG. 3). Inputted data Din is received on bus 106 by registers 103 for clocking to combinatorial logic 101 via bus 170 comprising individual connections Dout for each of the individual registers within registers 103. Division of the registers within registers 103, 104 and 105 is depicted by the dashed lines. The arrows crossing the dashed lines represents the passage of scan data from one scan register to the next (Sout to Sin).

Combinatorial logic 101 will perform predetermined logic functions upon the received data, which is then passed on to registers 104 on bus 171. This continues on through registers 104, bus 172, combinatorial logic 102, bus 173, and registers 105. Registers 105 may pass outputted data Dout on bus 107 to a next stage of combinatorial logic.

Logic portion 100 includes one possible scan chain comprising registers 103, 104 and 105. Scan data may be received from a previous register or from control logic 31 (see FIG. 3) into multiplexor circuit 108 for passage into scan registers 103. This scan data is serially passed through each of the scan registers within registers 103 and is outputted as signal Sout on line 111. This outputted scan data Sout may then be inputted to multiplexor circuit 109 for input into scan registers 104 on line 114. The process is repeated through scan registers 104 wherein the serial scan data is outputted on line 112 for input into multiplexor circuit 110 for passage into scan register 105. The serial scan data is outputted on line 113 for passage on to some other register or to input into scan control logic 31 for testing purposes (see FIG. 3). This serial scan configuration is for illustrative purposes only, since other possible scan routing configurations could be utilized.

Multiplexor circuits 108–110 allow for various types of scan operations to be performed. Using the SELECT signal received from scan control logic 31, multiplexor 108 may be enabled to receive scan data from a previous register or scan data from scan control logic 31 on line 120. Multiplexor circuit 109 may be operable for selecting scan data from line 111 or from control logic 31, and likewise multiplexor circuit 110 is operable for selecting scan data from line 112 or from control logic 31. The result is that a serial scan may be performed as previously described through each of the scan registers within registers 103–105. Alternatively, a partial scan operation may be performed whereby any one or more of registers 103–105 is not enabled for receiving and outputting scan data. Furthermore, an alternative scan operation, referred to as a parallel scan, would allow for parallel scan data to be received by each of registers 103–105 for output onto lines 111–113. This outputted parallel scan data would then be sent back to control logic 31. A further detailed discussion of these various scan operations is not required for a thorough understanding of the present invention.

For purposes of clarity, the connections providing the CLK, SCLK, CLK_SCLK_B and SCAN_ENABLE signals are not shown in FIG. 1. However, such connections could be routed to the various devices within logic portion 100 in a well-known manner.

Figure 2:
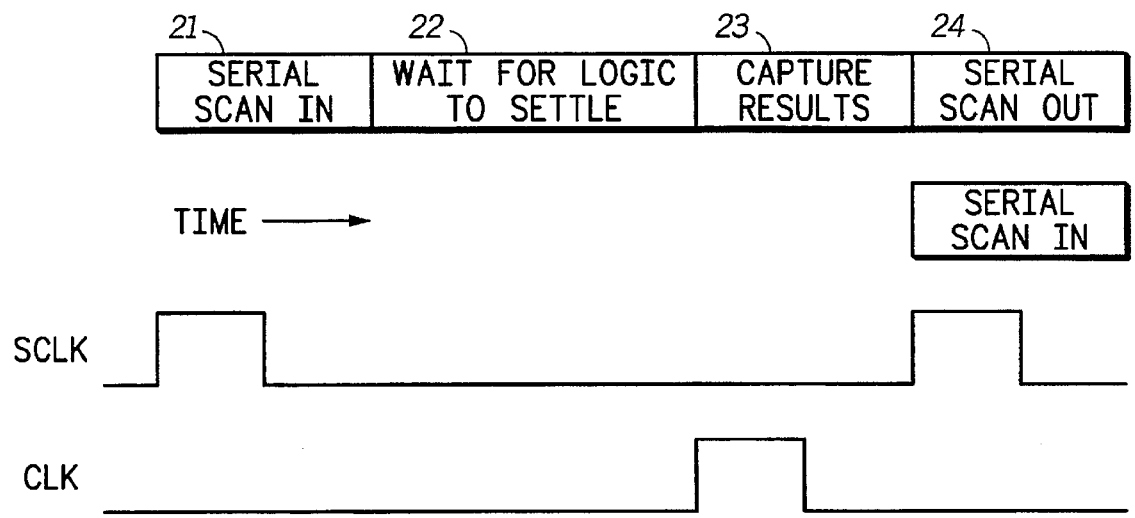
FIG. 2 illustrates the flow of information and clock signals possible during a scan operation.

An example of a scan operation is further illustrated in FIG. 2. Time periods 21–25 show various portions of a scan operation. In time period 21, serial scan data is scanned into scan registers 104 through connection 114. This serial scan data is then outputted on lines Dout to combinatorial logic 102. In time period 22, this scan data is allowed to settle through combinatorial logic 102 where it is then captured into scan registers 105 in time period 23. The data then residing within scan registers 105 is scanned out in time period 24 on connection 113. Simultaneously with the scanning out of this serial data, serial data is scanned into registers 105 from multiplexor circuit 110. Note, the CLK signal is activated during time period 23 in order to capture the scan data after settling through combinatorial logic 102 into scan registers 105.

An observation that should be made is that even though the loading of the scan chain can be high, the gate driving this load can be small. This is due to the fact that a scan register has half of the clock period (assuming a 50% duty cycle) to drive the Sout signal of one register to the master portion of the next register in the scan chain. The Dout signal on the other hand will normally have a tighter timing constraint, since it will have to propagate through some combinatorial logic before it can be loaded into another register master portion. Secondly, there is nothing to prevent the SCLK signal period from being much longer than the CLK signal period.

Figure 7:
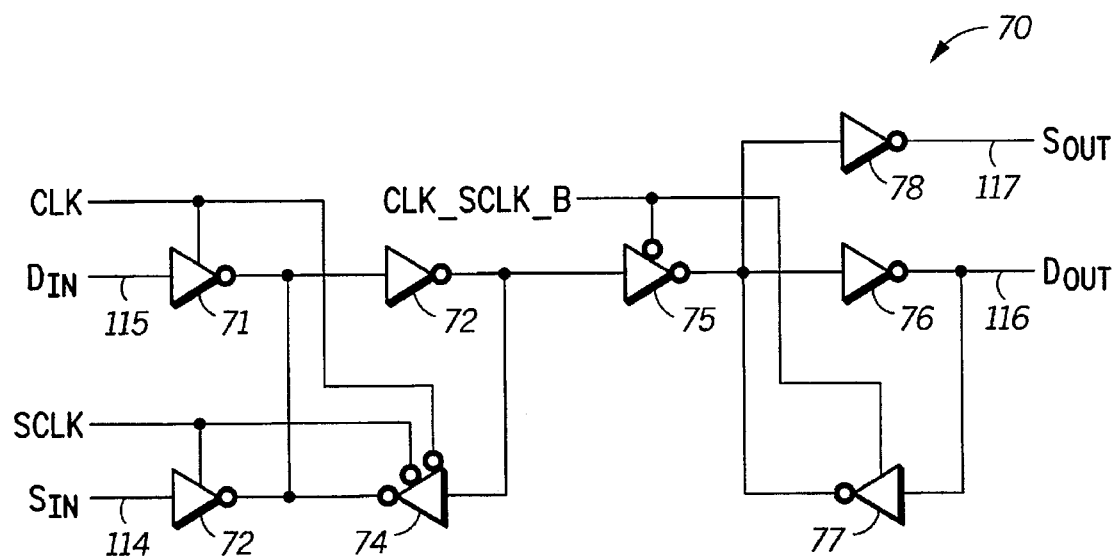
FIG. 7 illustrates one embodiment of an improved scan register.

Referring next to FIG. 7, there is illustrated scan register 70, which solves some of the previously mentioned problems associated with scan register 60. Devices 71–74 comprise the master portion of scan register 70, while devices 75–78 comprise the slave portion of scan register 70. The master portion of scan register 70 is identical to the master portion of scan register 60. The difference resides within the slave portion of scan register 70, wherein the Sout signal is decoupled from the Dout signal, by driving the Sout signal with inverter circuit 78. Since the loading due to the scan chain routing has been removed from the Dout signal, scan register 70 will be faster during normal operation. The loading of the additional inverter 78 to drive the Sout signal is generally not a problem, due to the fact that the Sout signal is not speed critical. Although scan register 70 reduces the delay through the register in normal operation, it does not improve the energy consumption of register 60. This is due to the fact that signal Sout will toggle every time signal Dout toggles. During normal operation, a user of a chip utilizing logic circuitry with scan register 70 does not care about the testability of the various scan registers and does not usually wish to "pay" for any power dissipation required through the toggling of signal Sout through inverter circuit 78. Most users desire lower power usage, especially within low power (energy) applications, such as the use of integrated circuitry within battery powered devices.

Figure 8:
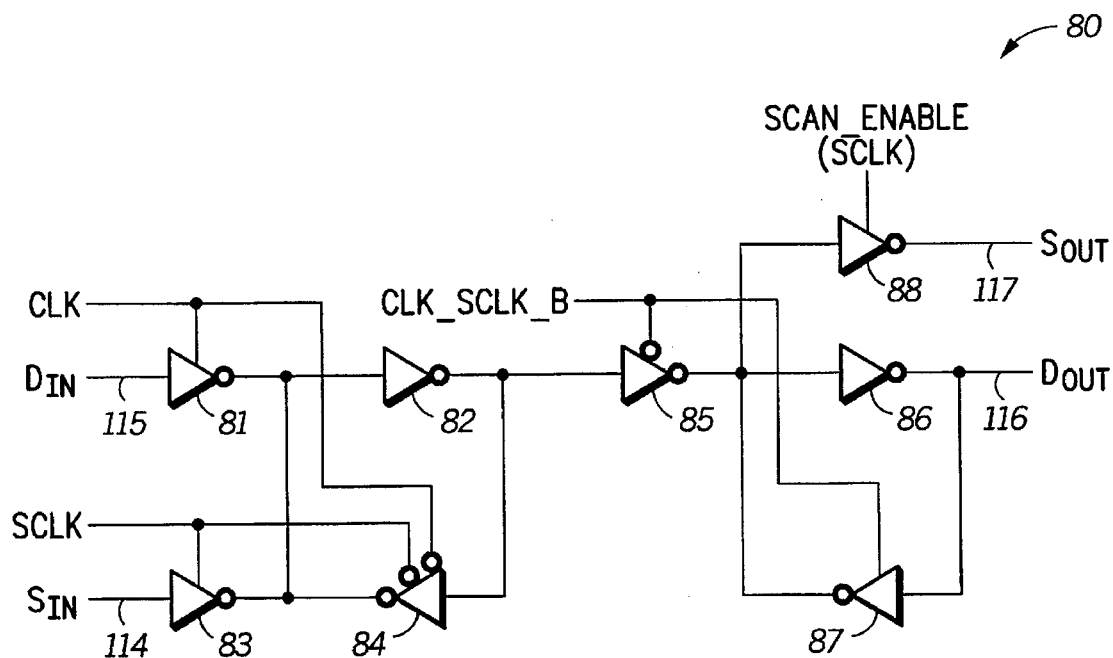
FIG. 8 illustrates another embodiment of an improved scan register.

Referring next to FIG. 8, there is illustrated scan register 80 showing a register structure that reduces energy consumption as well as delay through the register. Energy consumption is reduced by utilizing tri-state device 88 as opposed to device 78 in scan register 70 to decouple the Sout signal from the Dout signal. A tri-state device is a device that is capable of providing a high-impedance output. The SCAN_ENABLE signal is used to enable the transfer of the Sout signal to the next scan register in the scan chain only during scan mode. During normal operation, the SCAN_ENABLE signal is deactivated resulting in no toggling of the scan output.

If the Sout signal is to only pass to an Sin signal of a next scan register or to a tri-statable device, the Sout node can be allowed to float. However, if this is not the case, a NAND gate or other gate function can be used in place of tri-state device 88 to prevent a floating Sout signal.

Scan register circuits 70 and 80 reduce both energy consumption and delay through the register during normal operation. This can result in a significant energy savings based on the extent of the scan routing in the circuit. Since the circuit is rarely in scan mode, this routing capacitance will have a very low switching activity. This new approach presents very little additional loading and area cost to the register structure because the scan operation is not speed critical. The energy due to the SCAN_ENABLE signal is minimal since the switching activity of the signal is very low.

The present invention may be implemented within a level sensitive scan design (LSSD), as illustrated and described herein, which allows for the master and slave portions of a scan register to have separate clock enables so that the master and slave portions can be controlled separately. However, alternate embodiments of the present invention may use any type of scan latch, including, for example, muxed-data scan latches which are well-known in the art.

Referring next to FIG. 3, there is illustrated processor 30, which may be a central processing unit or any other type of microcontroller or microprocessor utilizing logic circuitry 100. FIG. 3 also illustrates scan/clock control logic 31, which is well-known in the art for receiving and generating clock signals, test enable signals and reset/exception signals, for outputting scan data (Sin), for receiving scan data (Sout), and for outputting the CLK, SCLK, CLK_SCLK_B and SELECT signals previously discussed herein.

Alternatively, a separate SCAN_ENABLE signal sent from control logic 31 may be utilized. This SCAN_ENABLE signal will be activated during a scan operation. One skilled in the art will be able to implement the production of the SCAN_ENABLE signal within control logic 31, such as tying the SCAN_ENABLE signal to the SCLK signal with some type of logic device.

Note that alternate embodiments of the present invention may use other types of logic gates in scan registers 70 and 80. For example, buffer 88 may alternately be a NAND gate. Buffers 82 and 86 may be implemented as NAND gates with set inputs or as NOR gates with reset inputs to force Dout to a predetermined logic state.

Although the present invention and its advantages have been described in detail, it should be understood that various changes, substitutions and alterations can be made herein without departing from the spirit and scope of the invention as defined by the appended claims.

We claim:

1. A scan register comprising:
    circuitry for receiving a data signal;
    circuitry for receiving a scan signal;
    circuitry, coupled to said circuitry for receiving said data signal, for outputting said data signal; and
    circuitry, coupled to said circuitry for receiving said scan signal, for outputting said scan signal, wherein said outputting circuitry for said data signal is separate from said outputting circuitry for said scan signal.

2. The scan register as recited in claim 1, further comprising:
    circuitry for passing said data signal and said scan signal, wherein said outputting circuitry for said data signal and said outputting circuitry for said scan signal are both coupled to said passing circuitry.

3. The scan register as recited in claim 1, wherein said outputting circuitry for said scan signal includes circuitry for selectively enabling and disabling said outputting circuitry for said scan signal.

4. The scan register as recited in claim 3, wherein said circuitry for selectively enabling and disabling said outputting circuitry for said scan signal further comprises a circuit controlled by receipt of a scan enable signal that is activated when a scan operation is enabled.

5. The scan register as recited in claim 1, wherein said outputting circuitry for said data signal further comprises:
    a first inverter coupled to said circuitry for receiving said data signal;
    a second inverter coupled to said first inverter; and
    a third inverter coupled to said first and second inverters, and
wherein said outputting circuitry for said scan signal further comprises:
    a logic circuit coupled to said first, second and third inverters.

6. The scan register as recited in claim 5, wherein said logic circuit is a fourth inverter that is responsive to a scan enable signal.

7. The scan register as recited in claim 6, wherein said scan enable signal is operable for disabling said fourth inverter.

8. A processor comprising:
    logic circuitry comprising a plurality of scan registers; and
    circuitry for enabling and disabling a scan operation through said plurality of scan registers,
wherein a scan register within said plurality of scan registers comprises:

circuitry for outputting a data signal;

circuitry for receiving a scan signal;

circuitry for outputting said scan signal; and circuitry for decoupling said circuitry for outputting said scan signal from said circuitry for outputting said data signal.

9. The processor as recited in claim 8, wherein said circuitry for outputting said scan signal is separate from said circuitry for outputting said data signal.

10. The processor as recited in claim 8, wherein said decoupling circuitry further comprises a device operable for receiving an activation signal from said circuitry for enabling and disabling said scan operation, wherein said activation signal is dependent upon said scan operation and operates to deactivate said device when said scan operation is disabled.

11. A register comprising:

a master portion operable for receiving a data signal, a scan signal, a data clock signal, and a scan clock signal; and a slave portion operable for receiving said scan signal or said data signal, wherein said slave portion further comprises:

a first inverter coupled between said master portion and a node;

a second inverter coupled to said node;

circuitry, coupled to said second inverter, for outputting said data signal;

a third inverter coupled to said circuitry for outputting said data signal and said node;

circuitry for outputting said scan signal; and a logic circuit coupled between said node and said circuitry for outputting said scan signal.

12. The register as recited in claim 11, wherein said logic circuit includes circuitry operable to receive an activation signal.

13. The register as recited in claim 12, wherein said activation signal operates to couple and decouple said circuitry for outputting said scan signal from said node.

14. The register as recited in claim 13, wherein said logic circuit is a fourth inverter.

* * * * *